United States Patent [19]

Spence

[11] Patent Number: 4,549,100
[45] Date of Patent: Oct. 22, 1985

[54] MOS VOLTAGE COMPARATOR AND METHOD

[75] Inventor: John R. Spence, Villa Park, Calif.

[73] Assignee: Rockwell International Corporation, El Segundo, Calif.

[21] Appl. No.: 492,102

[22] Filed: May 6, 1983

[51] Int. Cl.$^4$ .................... G01R 19/165; H03K 5/153
[52] U.S. Cl. .................................. 307/362; 307/530; 307/363
[58] Field of Search .............. 307/530, 350, 304, 571, 307/577, 362, 363, 572; 365/205, 208, 206, 207

[56] References Cited

U.S. PATENT DOCUMENTS 4,421,996 12/1983 Chuang et al. ...................... 307/530

Primary Examiner—Larry N. Anagnos
Assistant Examiner—Richard Roseen
Attorney, Agent, or Firm—H. Fredrick Hamann; S. Alfred Uchizono

[57] ABSTRACT

A semiconductor circuit and method for comparing an input signal voltage level against the circuit's supply voltage level and for providing a corresponding binary output signal, the circuit comprising first and second semiconductor devices for establishing voltage levels corresponding to the compared voltage levels on first and second nodes, respectively, third, fourth, fifth, and sixth semiconductor devices in combination with third, fourth, and fifth nodes arranged and connected to operate as a bistable element which is predisposed during a first time interval to favor one of the binary states in response to the difference in voltage levels established on the first and second nodes, and through the action of a seventh semiconductor device, which switches the main conductive path through the circuit off during the first interval and on during a second time interval, effecting a regenerative toggling of the bistable element to the favored state during the second time interval causing the desired binary signal to be output.

4 Claims, 3 Drawing Figures

MOS VOLTAGE COMPARATOR AND METHOD

FIELD OF THE INVENTION

This invention relates to a semiconductor circuit and method for comparing two voltage levels. More particularly, an input signal voltage level is compared against the circuit's supply voltage level to provide a binary output signal indicative of the relative magnitudes of the two compared voltage levels.

BACKGROUND OF THE INVENTION

In the microelectronics field, it is often necessary to be able to detect the onset of a power failure of the main supply to a circuit, such as a microprocessor, and to immediately provide a control or trigger signal to initiate a switchover to a backup or auxiliary power source. To provide fast reaction to such failure onset while minimizing false alarms, it is desirable to have a comparator circuit which compares accurately the slowly varying or D.C. voltage level of the main supply (serving as the comparator input signal level) against the level of the backup or auxiliary power source (also used to power the comparator circuit). Because of circuit nonlinearity, comparison accuracy tends to be limited for comparisons occurring near the supply voltage level. To minimize the effects of circuit nonlinearity and achieve comparison accuracies on the order of 0.1 to 0.2 volts, it is beneficial to employ signal amplification and particularly advantageous in producing a binary output signal to incorporate this amplification as part of a sequentially executed regenerative toggling of a bistable element. The binary output signal so produced can then be used to actuate other circuitry necessary to carry out the switchover to the backup or auxiliary power source.

SUMMARY OF THE INVENTION

The subject invention is a semiconductor circuit and method for comparing the magnitudes of two voltage levels where the comparison occurs at levels near the circuit supply voltage level, and outputting a binary signal as a result of and representative of the relative magnitudes of the compared voltage levels. The circuit is particularly adaptable to p-MOS integrated circuit technology.

The principle of operation of the circuit is conveniently described with reference to a sequence of successive first and second time intervals which together define an operating cycle. The circuit embodies a bistable element having dual current paths through the bistable element which come together to form a single main current path which is held alternately open and closed during the first and second time intervals, respectively. During the first time interval, because the main current path is open, the bistable element is prevented from manifesting either of the two binary states, even though the bistable element is predisposed to toggle to one of the two states urged upon it by the voltage imbalance between the input signal level and the supply voltage level. Upon closure of the main current path during the second time interval, the predisposed bistable element is freed to toggle to the state dictated by the voltage imbalance. Because of amplification and regenerative feedback features of the circuit, a slight imbalance is sufficient to push the circuit to the desired state and thereupon output a binary signal indicative of which of the two states prevails.

The invention further contemplates additional circuitry oroviding controlled current paths shunting the series combination of the bistable element and means for opening and closing the main current path, for purposes of improving the noise immunity of the circuit.

More particularized embodiments of the invention contemplate multi-terminal semiconductor devices having control and first and second conduction path terminals serving to provide the active functions as well as resistive functions. In even more specific embodiments, these multi-terminal semiconductor devices are combinations of p-channel MOS enhancement-mode and depletion-mode field effect transistors (FETs). A method for comparing an input signal voltage level against a semiconductor circuit's supply voltage level is also provided based on the principles described above.

DETAILED DESCRIPTION OF THE INVENTION

Figure 1:
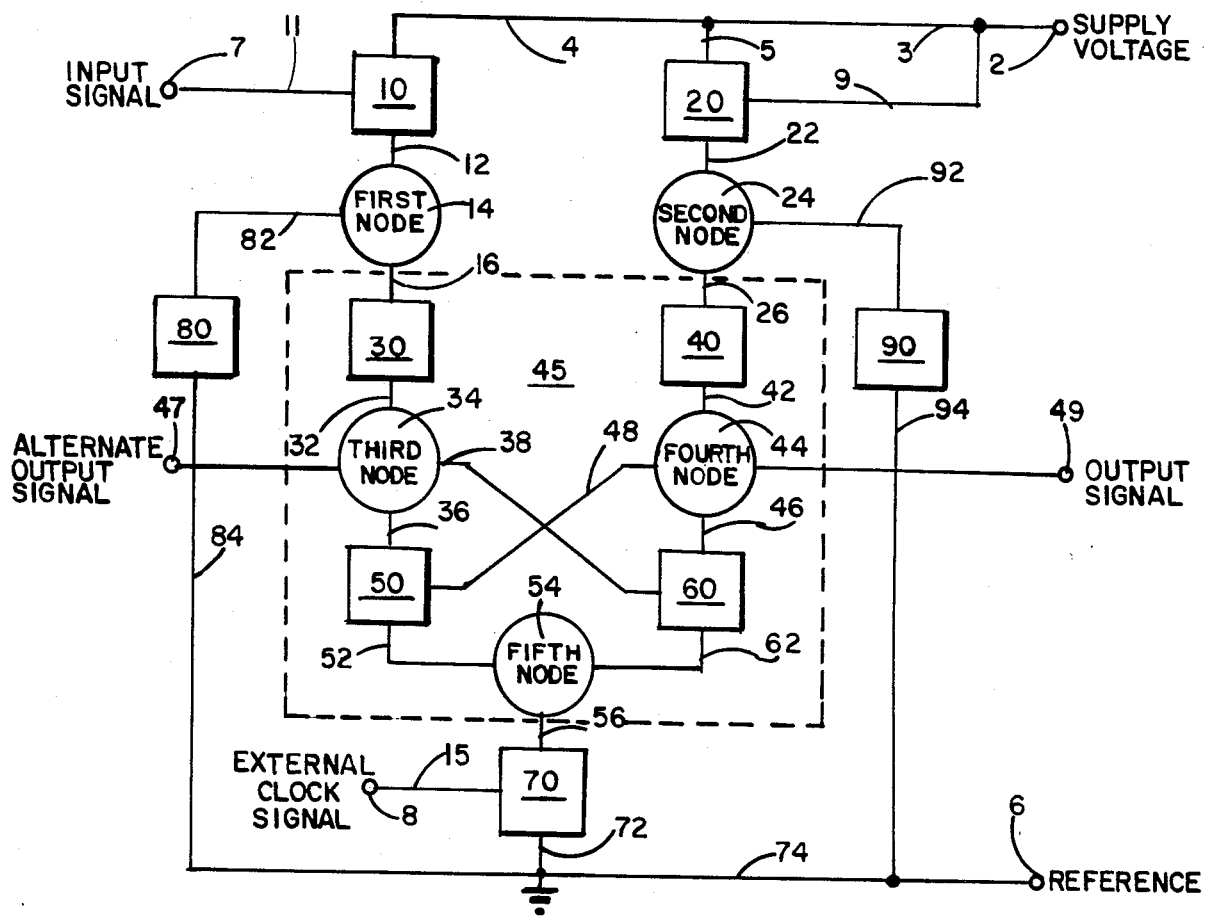
FIG. 1 is a block diagram of the preferred embodiment of the subject invention.

In the preferred embodiment of FIG. 1, the elements of the comparator circuit shown can be grouped into three functional sections. The input section comprises an input signal terminal 7, FIRST NODE 14, a first means 10 for coupling the INPUT SIGNAL to the FIRST NODE, SECOND NODE 24, a second means 20 for coupling the SUPPLY VOLTAGE provided at supply voltage terminal 2 to the SECOND NODE, eight and ninth means 80, 90 for providing controlled conduction between the FIRST NODE and SECOND NODE, respectively, and the reference terminal 6.

The second section, shown enclosed in the dashed border, functions as a bistable element 45 which comprises THIRD NODE 34, FOURTH NODE 44, FIFTH NODE 54, a third means 30 for conductively coupling the voltage level on the FIRST NODE to the THIRD NODE, a fourth means 40 for conductively coupling the voltage level on the SECOND NODE to the FOURTH NODE, a fifth means 50 for controlling conduction between the THIRD NODE and FIFTH NODE in response to the voltage level on the FOURTH NODE, and a sixth means 60 for controlling conduction between the FOURTH NODE and FIFTH NODE in response to the voltage level on the THIRD NODE.

The third section comprises a seventh means 70 for conductively connecting and isolating the FIFTH NODE 54 to and from the reference terminal 6 in response to the EXTERNAL CLOCK SIGNAL applied to terminal 8. This section is used to switch the main current through the input and bistable element sections on and off.

The INPUT SIGNAL is applied between the grounded reference terminal 6 and input signal terminal 7 which signal is fed to the input of first coupling means 10 by lead 11. The SUPPLY VOLTAGE is applied across the supply voltage terminal 2 and the reference terminal 6. The EXTERNAL CLOCK SIGNAL is applied between terminal 8 and the reference terminal 6, controlling the conductivity of seventh switching means 70 by lead 15. The OUTPUT SIGNAL is shown output at terminal 49. However, an ALTERNATE OUTPUT SIGNAL could alternatively be taken from THIRD NODE 34 as shown output at terminal 47 as well as the OUTPUT SIGNAL from the FOURTH NODE 44, depending upon the signal polarity required in the specific circuit application.

Two main current paths through the comparator circuit are available. A first path starting with the supply voltage terminal 2, proceeds over lead 3 and lead 4, passing through first means 10, over lead 12 to FIRST NODE 14, over lead 16, through third means 30, over lead 32 to THIRD NODE 34, over lead 36, through fifth means 50, and over lead 52 to FIFTH NODE 54.

A second path starting with lead 3 proceeds along lead 5 through second means 20, over lead 22 to SECOND NODE 24, over lead 26, through fourth means 40 and over lead 42 to FOURTH NODE 44, through lead 46 through sixth means 60 and over lead 62 to FIFTH NODE 54.

At FIFTH NODE 54, the two current paths are rejoined together into one main current path comprising lead 56 through seventh switch means 70 and over leads 72 and 74 to the reference terminal 6.

The other connections are control connections and typically do not represent main current paths. For example, lead 38 connecting the THIRD NODE 34 to the control input of sixth means 60 and lead 48 connecting the FOURTH NODE 44 to the control input of fifth means 50 are not main current bearing paths, but cross-coupled feedback paths.

Additionally, the current path from the FIRST NODE over lead 82, through eighth means 80, and over leads 84 and 74 to the reference terminal 6, and the current path from the SECOND NODE over lead 92, through ninth means 90, and over leads 94 and 74 to the reference terminal 6 are also ancillary current paths. These two ancillary paths from the FIRST NODE 14 and SECOND NODE 24 to the reference terminal 6 through first means and ninth means 90, respectively, provide noise immunity and are part of the preferred embodiment of the invention even though they are not necessary portions of all embodiments of the invention. Their employment is dictated primarily by the degree of noise immunity which is required.

Figure 2:
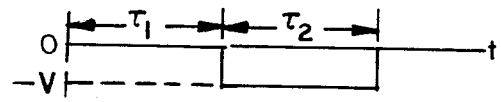
FIG. 2 is a timing diagram showing the operating cycle of the subject invention of FIG. 1.

The basic operation of the circuit of FIG. 1 is as follows:

The operating cycle of the comparator circuit is defined by first and second time intervals. In FIG. 2 there is shown a typical external clock signal which is used to control the comparator circuit of FIG. 1. There is shown in FIG. 2 time intervals $\tau_1$, corresponding to the first time interval, and time interval $\tau_2$, corresponding to the second time interval. Together the time intervals, $\tau_1$ and $\tau_2$, comprise the operating cycle. As pointed out above, the EXTERNAL CLOCK SIGNAL is applied to terminal 8 which in turn controls the conduction through seventh means 70. During $\tau_1$, the clock signal level on terminal 8 is such as to prevent conduction through seventh means 70 thereby preventing the main current flow from the FIFTH NODE to reference terminal 6 from taking place. During $\tau_2$, the clock signal level on terminal 8 is such as to cause seventh means 70 to conduct, thereby allowing the main current path to be completed.

During $\tau_1$ the INPUT SIGNAL is applied at terminal 7 which is connected by lead 11 to the control terminal of first means 10. First means 10 is for providing a coupling of the INPUT SIGNAL level to the FIRST NODE 14 to establish a first voltage level on the FIRST NODE. In a like manner, the SUPPLY VOLTAGE is applied to the control terminal of second means 20 through lead 9, such that a second voltage level is established on SECOND NODE 24. To the extent that the coupling process through first means 10 and second means 20 are matched, the voltage levels appearing on the input terminal 7 and on lead 9 will be manifest on FIRST NODE 14 and SECOND NODE 24, respectively, such tnat any voltage difference existing between the voltage level on terminals 7 and lead 9 will be reproduced at the FIRST NODE and SECOND NODE with a small DC offset relative to the DC levels at terminal 7 and lead 9.

Therefore, during $\tau_1$, voltage levels are established on FIRST NODE 14 and SECOND NODE 24 such that the bistable element 45 is predisposed to toggle to a conduction state in one or the other of the two main current paths which favors the existence of a lower voltage level on its corresponding FIRST NODE 14 or SECOND NODE 24. Therefore, when the seventh means 70 is allowed to conduct during $\tau_2$, that current path which has the smaller magnitude voltage level on either of FIRST NODE 14 or SECOND NODE 24, will conduct more heavily than the other path because of the cross coupling feature of the bistable element 45, i.e., lead 38 which couples a third voltage level on THIRD NODE 34 to the control input of sixth means 60 and lead 48 which couples a fourth voltage level on FOURTH NODE 44 to the control input of fifth means 50.

For example, if the magnitude of the first voltage level on FIRST NODE 14 is greater than the second voltage level on SECOND NODE 24, then the third voltage level on the THIRD NODE 34 will be greater than the fourth voltage level on the FOURTH NODE 44. Therefore, because the third voltage level is coupled to the control terminal of sixth means 60, the sixth means 60 would have a tendency to conduct more heavily than the fifth means 50 if current through either of the fifth or sixth means were allowed to flow. Upon the external clock signal going from 0 volts to $-V$ volts, as shown in FIG. 2, and assuming that a negative SUPPLY VOLTAGE is used, the seventh means 70 will be caused to conduct thereby closing the main current path. Therefore, as current begins to flow, a regenerative effect takes place since sixth means 60 will tend to conduct more heavily, thereby reducing the fourth voltage level on FOURTH NODE 44, which in turn will tend to reduce the current flow through fifth means 50 which in turn will cause the third voltage level on THIRD NODE 34 to increase, thereby causing sixth means 60 to conduct even more heavily, thereby eventually establishing a stable state where sixth means 60 is conducting fully and the current through fifth means 50 is minimized or turned off.

At the end of the operating cycle, the external clock signal is once again turned off or reduced to 0 volts, such that the seventh means 70 is once again turned off, thereby providing an open circuit to the main current path. The circuit is then allowed to reset in preparation for the next voltage comparison.

The third means 30 and fourth means 40 are means for conductively coupling voltages on FIRST NODE 14 and SECOND NODE 24, respectively, to THIRD NODE 34 and FOURTH NODE 44, respectively, and can be active or passive devices. The resistance of third means 30 and fourth means 40 relative to the impedance provided by fifth means 50 and sixth means 60 in their full conducting states are such that a voltage gain of greater than one exists, i.e., the voltage level difference between FIRST NODE 14 and SECOND NODE 24 is amplified. As pointed out earlier, the OUTPUT SIGNAL is then taken from FOURTH NODE 44, i.e., the fourth voltage level, at output terminal 48. The logical complement of this signal, identified as ALTERNATE OUTPUT SIGNAL, can be obtained from THIRD NODE 34 at alternate output signal terminal 47.

To provide noise immunity, a relatively high impedance path is provided between FIRST NODE 14 and SECOND NODE 24 and the reference terminal 6, the reference terminal typically being tied to ground. These noise immunity circuits comprise a high impedance path to ground provided by eighth means 80 and ninth means 90 connected between FIRST NODE 14 and SECOND NODE 24, respectively, to the reference terminal 6. This impedance can be provided either by an active or passive components.

In the embodiment of FIG. 1 each of the first through ninth means 10, 20, 30, 40, 50, 60, 70, 80, 90 can be implemented using a multi-terminal semiconductor device having a control terminal and first and second conduction path terminals. Further, each of these multi-terminal semiconductor devices can also be defined as p-channel MOS field effect transistors (FETs), wherein the first means 10, second means 20, fifth means 50, sixth means 60, and seventh means 70 are enhancement-mode FETs and the third means 30, fourth means 40, eighth means 80, and ninth means 90 are depletion-mode FETs.

Figure 3:
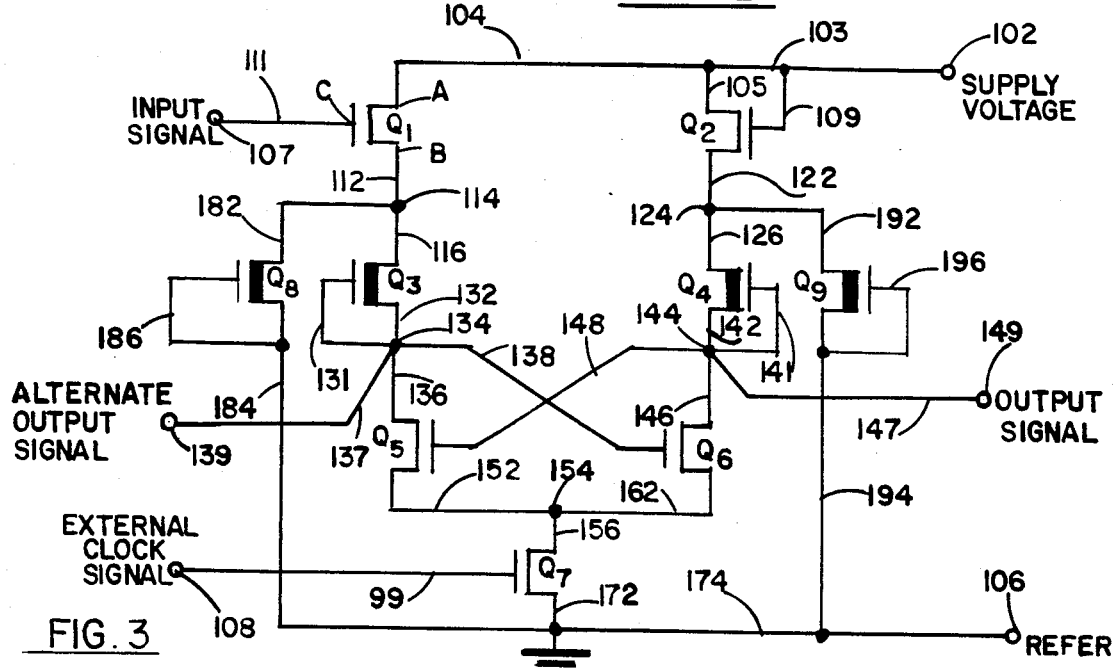
FIG. 3 is an electronic schematic diagram of a specific embodiment of the subject invention.

In FIG. 3, a more specific circuit diagram is presented of the present invention. There is shown in FIG. 3 nine multi-terminal semiconductor devices, Q1 through Q9. Each of these multi-terminal semiconductor devices has first and second conduction path terminals, for example, as indicated at A and B of Q1. Each of these devices also has a control terminal, for example, as indicated at C of Q1. Similarly, each of the other devices Q2 through Q9 also have first and second conduction path terminals such as A and B of Q1 and a control terminal such as terminal C of Q1. More specifically, each of the devices is a field effect transistor (FET). Devices Q1, Q2, Q5, Q6, and Q7 are each enhancement-mode FETs. Devices Q3, Q4, Q8, and Q9 are depletion-mode FETs.

The INPUT SIGNAL is applied to terminal 107 which is connected over lead 111 to terminal C of Q1 which is the gate or control terminal. Similarly, the SUPPLY VOLTAGE, applied between supply voltage terminal 102 and reference terminal 106, is connected to the gate terminal of Q2. The SUPPLY VOLTAGE is connected, also, to the first conduction path terminals of Q1 and Q2 through leads 103, 104, and 105. The second conduction path terminal of Q1 is tied to the first conduction path terminal of Q3 by leads 112 and 116. The gate of Q3 is tied to node 134 by lead 131. The second conduction path terminal of Q3 is tied to node 134 by lead 132. The node 134 is tied to the first conduction path terminal of Q5 by lead 136. The second conduction path of terminal of Q5 is tied to the node 154 by lead 152. The first conduction path terminal of Q2 is tied to the supply voltage terminal 102 through leads 103 and 105. The second conduction path terminal Q2 is tied to node 124 by lead 122. The node 124 is tied to the first conduction path terminal of Q4 through lead 126. The gate of Q4 is tied to node 144 through lead 141. The second conduction path terminal of Q4 is tied to node 144 by lead 142. Node 144 is tied to the first conduction path terminal of Q6 through lead 146. The second conduction path terminal of Q6 is tied to node 154 by lead 162. The cross coupling of node 134 to the gate of Q6 is made through lead 138 and the cross coupling of the node 144 to the gate of Q5 is made by lead 148. The node 154 is connected to the first conduction path terminal of Q7 by lead 156 and the second conduction path terminal of Q7 is tied to the reference terminal 106 through leads 172 and 174. The main current path between node 154 and the reference terminal 106, shown tied to ground, is completed by turning the FET Q7 on. This is done by applying the appropriate EXTERNAL CLOCK SIGNAL level signal on terminal 108, which in turn is connected to the gate of Q7 by lead 99.

The operation of the circuit is much as described with reference to FIG. 1. A first of two main current paths is through FETs Q1, Q3, and Q5, to the node 154. The second main current path is through FETs Q2, Q4, and Q6, to the node 154. The common path between 154 and the reference terminal 106 is switched by FET Q7 in response to an EXTERNAL CLOCK SIGNAL applied to terminal 108. FET Q8, by lead 182 tied to node 114 and over leads 184 and 174 to the reference terminal 106, and FET Q9, by lead 192 tied to node 124 and over lead 194 and 174 to the reference terminal 106, are used to provide a noise immunity feature to the circuit by furnishing a relatively high impedance between nodes 114 and 124, respectively, and the reference terminal 106. Q8 and Q9 are depletion-mode FETs which are biased normally on by tying the gates of each of these devices to the second conduction path terminal of each by leads 186 and 196, respectively.

The accuracy with which this voltage comparison takes place depends upon the accuracy with which the threshold voltages of Q1 and Q2 are matched. Typically, these threshold voltages are within 0.1 to 0.2 volts of each other. Therefore, the voltages which appear on nodes 114 and nodes 124 are offset from their respective input signals on the gates of Q1 and Q2 by an amount corresponding to the threshold voltages of those devices. Therefore, the voltage levels appearing on nodes 114 and 124 reflect the differences in voltage levels of the input signal relative to the supply voltage to within the accuracy to which the threshold voltages of Q1 and Q2 are matched.

During the first time interval $\tau_1$, this voltage level difference will cause the bistable element, comprising Q1, Q4, Q5, and Q6 along with node 154, to be predisposed to a state which, if allowed to conduct, would regeneratively toggle to establish a condition on nodes 134 and 144 which favors conduction of that oath which has the lesser of voltages on nodes 114 or 124. For example, if the input signal level on terminal 107 is less than the supply voltage level, and assuming the threshold voltages of Q1 and Q2 are the same, the voltage level on node 114 will be less than the voltage level on node 124, these voltage levels also appearing on nodes 134 and 144, respectively, during the first time interval $\tau_1$ because of the absence of current through Q3 and Q4. Therefore, if the voltage level on node 134 is less than the voltage level on node 144, uoon the closure of FET Q7, current will tend to flow more heavily through device Q5 than through device Q6. Therefore, the voltage level on node 134 will tend to be less than the voltage level on node 144, thereby causing Q5 to conduct even more heavily, and causing the voltage level of node 134 to drop to even a lesser degree, causing FET Q6 to turn off even more, causing the voltage level on node 144 to increase even more. This process continues until Q5 is full on and Q6 is either turned off or at a minimum current level. The OUTPUT SIGNAL on output signal terminal 148 is provided by lead 147 connected between node 144 and terminal 148. Alternatively, the logical complement of the output signal, identified in the figure as ALTERNATE OUTPUT SIGNAL, is available on terminal 134 and is output on alternate output signal terminal 139 by lead 137 connecting terminals 134 to 137.

Although the invention has been described and illustrated in detail, it is to be clearly understood that the same is by illustration and example only and is not to be taken by way of limitation, the spirit and scope of this invention being limited by the terms of the appended claim.

I claim:

1. A semiconductor circuit for comparing an input signal voltage level against said circuit's supply voltage level and for providing a binary output signal in which a first binary state is outputted if said input signal voltage level exceeds the magnitude of level substantially equal to said supply voltage level, and in which a second binary state is outputted otherwise, said circuit adapted to operate from an external voltage supply providing said supply voltage level and a reference level at supply voltage and reference terminals, respectively, and controlled by an external clock signal defining an operating cycle having successive first and second time intervals, said circuit comprising:

first, second, third, fourth, and fifth nodes;
a first means connected to said supply voltage terminal and responsive to said input signal for coupling said input signal to said first node to establish and maintain a first voltage level thereon in controlled relation to said input signal voltage level during said operating cycle;
a second means connected to said supply voltage terminal and responsive to said supply voltage for coupling said supply voltage to said second node to establish and maintain a second voltage level thereon in controlled relation to said supply voltage level during said operating cycle;
a third means for conductively coupling said first voltage level to said third node to establish a third voltage level thereon during said operating cycle;
a fourth means for conductively coupling said second voltage level to said fourth node to establish a fourth voltage level thereon during said operating cycle;
a fifth means for controlling conduction between said third and fifth nodes in response to said fourth voltage level on said fourth node during said operating cycle;
a sixth means for controlling conduction between said fourth and fifth nodes in response to said third voltage level on said third node during said operating cycle;
a seventh means responsive to said clock signal for conductively connecting said fifth node to said reference terminal during said second time interval and for conductively isolating said fifth node from said reference terminal during said first time interval;
eighth means for providing a controlled conduction between said first node and said reference terminal responsive to said reference level throughout said operating cycle; and
ninth means for providing a controlled conduction between said second node and said reference terminal responsive to said reference level throughout said operating cycle;
said third, fourth, fifth, and sixth means in combination with said third, fourth, and fifth nodes arranged and connected to operate as a bistable circuit element, the comparative magnitudes of said first and second voltage levels on said first and second nodes, respectively, urging upon said bistable element during said first time interval, a predisposition to regeneratively toggle to a binary state favored by said predisposition upon said seventh means conductively connecting said fifth node to said reference terminal during said second time interval, thereupon causing said binary output signal to be outputted on said fourth node, said output signal corresponding to said first binary state if the magnitude of said input signal voltage level has exceeded the magnitude of a voltage level equal to said supply voltage level, and said binary output signal corresponding to said second binary state if the magnitude of said input signal voltage level is less than or equal to said supply voltage level otherwise.

2. The semiconductor circuit according to claim 1, wherein:

said first means is a first multi-terminal semiconductor device having a control terminal to which said input signal is applied, a first conduction path terminal connected to said supply voltage terminal, and a second conduction path terminal connected to said first node;
said second means is a second multi-terminal semiconductor device having a control terminal and a first conduction path terminal connected to said supply voltage terminal and a second conduction path terminal connected to said second node;
said third means is a third multi-terminal semiconductor device having a first conduction path terminal connected to said first node and a control terminal and a second conduction path terminal connected to said third node;
said fourth means is a fourth multi-terminal semiconductor device having a first conduction path terminal connected to said second node and a control terminal and a second conduction path terminal connected to said fourth node;
said fifth means is a fifth multi-terminal semiconductor device having a first conduction path terminal connected to said third node, a second conduction path terminal connected to said fifth node, and a control terminal connected to said fourth node;
said sixth means is a sixth multi-terminal semiconductor device having a first conduction path terminal connected to said fourth node, a second conduction path terminal connected to said fifth node, and a control terminal connected to said third node;
said seventh means is a multi-terminal semiconductor device having a first conduction path terminal connected to said fifth node, a second conduction path terminal connected to said reference terminal, and a control terminal to which the external clock signal is applied;
said eighth means is a multi-terminal semiconductor device having a first conduction path terminal connected to said first node and a control terminal and a second conduction path terminal connected both to said reference terminal; and said ninth means is a multi-terminal semiconductor device having a first conduction path terminal connected to said second node and a control terminal and a second conduction path terminal connected both to said reference terminal.

3. A MOS voltage comparator circuit for comparing the voltage level of an input signal against the circuit supply voltage level and for providing a unique binary output signal in which a first binary state is output if said input signal voltage level exceeds the magnitude of a level substantially equal to said supply voltage level, and in which a second binary state is output otherwise, said circuit adapted to operate from an external voltage supply providing said supply voltage level and a reference level at supply voltage and reference terminals, respectively, and controlled by an external clock signal defining an operating cycle having successive first and second time intervals, said circuit comprising:

first, second, third, fourth, and fifth nodes;

a first enhancement-mode FET connected between said supply voltage terminal and said first node and having a gate terminal adapted to receive said input signal;

a first depletion-mode FET connected between said first and third nodes and having a gate terminal connected to said third node;

a second enhancement-mode FET connected between said third and fifth nodes and having a gate terminal connected to said fourth node;

a third enhancement-mode FET connected between said supply voltage terminal and said second node and having a gate terminal connected to said supply voltage terminal;

a second depletion-mode FET connected between said second and fourth nodes and having a gate terminal connected to said fourth node;

a fourth enhancement-mode FET connected between said fourth and fifth nodes and having a gate terminal connected to said third node;

a fifth enhancement-mode FET connected between said fifth node and said reference terminal and having a gate terminal adapted to receive said external clock signal for controlling fifth enhancement-mode FET conduction;

a third depletion-mode FET connected between said first node and said reference terminal and having a gate terminal connected to said reference voltage terminal; and a fourth depletion-mode FET connected between said second node and said reference voltage terminal and having a gate terminal connected to said reference voltage terminal;

said fifth enhancement-mode FET being turned off during said first time interval and turned on during said second time interval in response to said external clock signal, enabling said fourth enhancement mode FET during said second time interval to conduct more heavily and said second enhancement mode FET less heavily in regenerative relation when the level of said input signal level exceeds a level equal to said supply voltage level and, conversely, when the level of said input signal does not exceed a level substantially equal to said supply voltage level, thereby providing said unique logical output signal at said fourth node.

4. A method for comparing an input signal voltage level against a semiconductor circuit's supply voltage level and for providing a binary output signal in which a first binary state is output if said input signal voltage level exceeds the magnitude of a level substantially equal to said supply voltage level, and in which a second binary state is output otherwise, said circuit adapted to operate from an external voltage supply providing said supply voltage level and a reference level both respectively provided at supply voltage terminal and reference terminal, and controlled by an external clock signal defining an operating cycle having successive first and second time intervals, said method comprising the steps of:

coupling said input signal through a first means to a first node to establish and maintain a first voltage level thereon in controlled relation to said input signal voltage level during said operating cycle;

coupling said supply voltage through a second means to a second node to establish and maintain a second voltage level thereon in controlled relation to said supply voltage level during said operating cycle;

conductively coupling said first voltage level through a third means to a third node to establish a third voltage level thereon during said operating cycle;

conductively coupling said second voltage level through a fourth means to a fourth node to establish a fourth voltage level thereon during said operating cycle;

controlling conduction between said third and fifth nodes by a fifth means in response to said fourth voltage level on said fourth node during said operating cycle;

controlling conduction between said fourth and fifth nodes by a sixth means in response to said third voltage level on said third node during said operating cycle;

conductively isolating said fifth node from said reference terminal by a seventh means during said first time interval in response to said clock signal; and conductively connecting said fifth node to said reference terminal during said second time interval in response to said clock signal;

said third, fourth, fifth, and sixth means in combination with said third, fourth, and fifth nodes arranged and connected to operate as a bistable circuit element, the comparative magnitudes of said first and second voltage levels on said first and second nodes, respectively, urging upon said bistable element during said first time interval, a predisposition to maintain or regeneratively toggle to a binary state favored by said predisposition upon said seventh means conductively connecting said fifth node to said reference terminal during said second time interval, thereupon causing said binary output signal to be output on said fourth node, said output signal corresponding to said first binary state if the magnitude of said input signal voltage level has exceeded the magnitude of a voltage level equal to said supply voltage level, and to said second binary state otherwise.

* * * * *

UNITED STATES PATENT AND TRADEMARK OFFICE
CERTIFICATE OF CORRECTION

PATENT NO. : 4,549,100
DATED : October 22, 1985
INVENTOR(S) : John R. Spence

It is certified that error appears in the above-identified patent and that said Letters Patent are hereby corrected as shown below:

Column 2, line 2 - change "oroviding" to "providing"

Column 3, line 39 - insert "80" after the word "means" and before the words "and ninth"

Column 4, line 10 - change "tnat" to "that"

Column 6, line 53 - change "oath" to "path"

Column 6, line 63 - change "uoon" to "upon"

Column 9, line 50 - delete the word "voltage"

Column 9, line 53 - delete the word "voltage"

Signed and Sealed this

Twenty-second Day of April 1986

[SEAL]

Attest:

DONALD J. QUIGG

Attesting Officer  Commissioner of Patents and Trademarks